United States Patent
De Marchi et al.

(10) Patent No.: US 9,583,158 B2
(45) Date of Patent: Feb. 28, 2017

(54) METHOD OF MANAGING REQUESTS FOR ACCESS TO MEMORIES AND DATA STORAGE SYSTEM

(71) Applicant: SIMPULSE, Marcoussis (FR)

(72) Inventors: Stephane De Marchi, Paris (FR); Emmanuel Hamman, Marcoussis (FR)

(73) Assignee: SIMPULSE, Palaiseau (FR)

( * ) Notice: Subject to any disclaimer, the term of this patent is extended or adjusted under 35 U.S.C. 154(b) by 0 days.

(21) Appl. No.: 14/375,052

(22) PCT Filed: Jan. 27, 2013

(86) PCT No.: PCT/EP2013/051523
§ 371 (c)(1),
(2) Date: Jul. 28, 2014

(87) PCT Pub. No.: WO2013/110802
PCT Pub. Date: Aug. 1, 2013

(65) Prior Publication Data
US 2015/0006842 A1     Jan. 1, 2015

(30) Foreign Application Priority Data

Jan. 27, 2012  (FR) ..................................... 12 00248

(51) Int. Cl.
  *G11C 7/10*   (2006.01)
  *G06F 12/06*  (2006.01)
  *G06F 13/16*  (2006.01)

(52) U.S. Cl.
  CPC ............ *G11C 7/1072* (2013.01); *G06F 12/06* (2013.01); *G06F 13/1615* (2013.01)

(58) Field of Classification Search
CPC .................................................. G06F 13/1615
See application file for complete search history.

(56) References Cited

U.S. PATENT DOCUMENTS 6,788,585 B1     9/2004 Eitrheim et al.
8,930,641 B1 *   1/2015 Kapasi .................... G06F 13/28
                                                        711/149

(Continued)

OTHER PUBLICATIONS

Reisis D et al.: "Conflict-Free Parallel Memory Accessing Techniques for FFT Architectures", IEEE Transactions on Circuits and Systems I: Regular Papers, IEEE, US, vol. 55, No. 11, Dec. 1, 2008, pp. 3438-3447, XP0I13333II, ISSN: 1549-8328, DOI: 10.1109/TCSI.2008.924889 the whole document.

(Continued)

*Primary Examiner* — David X Yi
*Assistant Examiner* — Zubair Ahmed
(74) *Attorney, Agent, or Firm* — Young & Thompson

(57) ABSTRACT

The method includes, at a first clock cycle:—obtaining (202) new requests by the processing stage;—supplying (210) by the processing stage at least one of the new requests;—placing on standby (212) by the processing stage at least one further new request, hereinafter referred to as a standby request. The method further includes, at a second clock cycle following the first clock cycle:—obtaining (202) at least one new request by the processing stage;—selecting (208) by the processing stage, from the standby request(s) and the new request(s), at least one request;—la supplying (210) the selected request(s) by the processing stage.

10 Claims, 1 Drawing Sheet

(56) References Cited

U.S. PATENT DOCUMENTS

| | | | |
|---|---|---|---|
| 2005/0223129 A1* | 10/2005 | Tran | G06F 13/28 |
| | | | 710/22 |
| 2008/0082707 A1* | 4/2008 | Gupta | G06F 13/364 |
| | | | 710/110 |
| 2009/0049256 A1* | 2/2009 | Hughes | G06F 13/1626 |
| | | | 711/158 |

OTHER PUBLICATIONS

Kuusilinna K et al.: "Configurable parallel memory architecture for multimedia computers", Journal of Systems Architecture. Elsevier BV. N L. vol. 47. No. 14-15. Aug. 1, 2002. pp. 1089-1115, XP004375023, ISSN: 1383-7621. 001: 10.1016/S1383-7621(02)00059-0 the whole document.

International Search Report, dated Mar. 1, 2013, from corresponding PCT application.

\* cited by examiner

METHOD OF MANAGING REQUESTS FOR ACCESS TO MEMORIES AND DATA STORAGE SYSTEM

The present invention relates to a method for handling memory access requests and a data storage system.

BACKGROUND OF THE INVENTION

Processors working on a multiple data in parallel exist, such as for example Digital Signal Processors (DSP), Single Instruction on Multiple Data (SIMD) processors, Long Instruction Word (LIW) processors, or vector processors, i.e. designed to perform operations on multiple numbers (representing vectors or arrays) during a single clock cycle.

Such processors need to be able to read and write a set of data at the same time as quickly as possible.

This data may be stored in various memories which need to be used optimally to maximum high-speed access.

Using a storage system intended to be timed by a clock signal and comprising a plurality of memories is thus known.

Each memory comprises a certain number of input and output ports. Each input port is intended to receive a request for access to one of the memory locations, tagged by the address thereof, referred to as the local address, in the memory. The memory is intended to receive local requests at each clock cycle and to respond thereto in a predefined number of clock cycles. The memory is further intended to submit, at the end of said clock cycle(s), any responses on the output ports thereof. In this way, a memory can only receive, for each clock cycle, a limited number of local requests, at most equal to the number of input ports of this memory.

A conventional type of memory is for example a single-port (one input port and one associated output port) or double-port (two input ports and two associated output ports) Random Access Memory (RAM).

The storage system further comprises input ports and one or a plurality of output ports. Each input port is intended to receive, at each clock cycle, a request to access a location of one of the memories. This request indicates a global address structured as if the storage system formed a single memory. Using a correspondence function associating each global address with one of the memories and with a local address in this memory is thus known.

During the same clock cycle, the storage system may receive on the input ports thereof a greater number of requests for access to the same memory than that which can be received by the memory on the input ports thereof. A conflict thus arises since the memory will not be able to receive all these requests in the same clock cycle.

It is thus necessary to implement an effective method for handling requests to reduce the frequency of conflicts.

A number of publications exist, describing methods for handling memory access requests, including:

the thesis by Eero Aho entitled *"Design and Implementation of Parallel Memory Architectures"*, and published in 2006 in Tampere University of Technology, Publication 641, the article by Kimmo Kuusilinna et al. entitled *"Configurable parallel memory architecture for multimedia computers"*, and published in 2002 in Journal of Systems Architecture 47 (2002) 1089-1115, and the article by Dionysios Reisis et al. entitled *"Conflict-Free Parallel Memory Accessing Techniques for FFT Architectures"*, and published in 2008 in IEEE Transactions on circuits and systems, I—Regular papers, vol. 55, No. 11, Dec. 2008.

These methods all suggest optimising the correspondence function as a function for the predictable distribution of memory access.

These methods for handling requests involve the problem of not being very effective for more complex applications, such as Fast Fourier Transform (FFT) with a radix changing over time according to the size of the vectors on the basis whereof the FFT is computed, or applications wherein random or near-random locations are accesses. In this way, memory access is difficult to predict such that it is not possible to optimise the correspondence function.

SUMMARY OF THE INVENTION

In this way, it may be sought to have a method for handling requests suitable for reducing the frequency of conflicts even in the case of applications wherein memory access is difficult to predict.

For this purpose, the invention relates to a method for handling requests received by a storage system comprising memories, an input intended to receive a clock signal defining successive clock cycles, and a processing stage, the storage system being intended to receive requests each requesting access to a location of one of the memories, the method comprising, at a first clock cycle:—the processing stage obtaining new requests;—the processing stage supplying at least one of the new requests;—the processing stage placing on standby at least one further new request, hereinafter referred to as a standby request;

the method being characterised in that it comprises, at a second clock cycle following the first clock cycle:—the processing stage obtaining at least one new request;—the processing stage selecting, from the standby request(s) and the new request(s), at least one request;—the processing stage supplying the selected request(s).

Optionally, the requests are supplied by the processing stage to a next processing stage in the storage system.

Optionally, the next processing stage comprises the memories.

Optionally, the selection by the processing stage of at least one request comprises the selection of a standby request.

Optionally, the selection by the processing stage of at least one request comprises the selection of a new request obtained at the second clock cycle.

Optionally, the method further comprises:—determining the existence or not of a standby request at each of the L clock cycles preceding the current clock cycle, L being a predefined number greater than or equal to two, such a request being referred to as a priority request; and obtaining by means of processing stage at least one new request is carried out when the existence of no priority request is determined.

Optionally, the method further comprises:—determining the existence or not of a standby request at each of the L clock cycles preceding the current clock cycle, L being a predefined number greater than or equal to two, such a request being referred to as a priority request;—when the existence of at least one priority request is determined, the processing stage suspending obtaining new requests for the current clock cycle.

Optionally, for at least one memory, the selection of at least one request intended to be supplied to this memory is carried out so as to select the greatest possible number of requests that the memory can receive at the next clock cycle.

Optionally, for at least one memory, the selection of at least one request intended to be supplied to this memory is carried out by giving priority to the requests placed on standby for the greatest number of clock cycles.

The invention also relates to a data storage system comprising:—memories, the storage system being intended to receive requests each requesting access to a location of one of the memories;—an input intended to receive a clock signal defining successive clock cycles;—a processing stage intended, at a first clock cycle, to:—obtain new requests;—supply at least one of the new requests;—place at least one further new request on standby, hereinafter referred to as a standby request;

the storage system being characterised in that the processing stage is further intended, at a second clock cycle following the first clock cycle, to:—obtain at least one new request;—select, from the standby request(s) and the new request(s), at least one request intended to be supplied;—supply the selected request(s).

BRIEF DESCRIPTION OF THE DRAWINGS

Examples of embodiments of the invention will now be described with reference to the following figures.

DETAILED DESCRIPTION OF THE PREFERRED EMBODIMENTS

Figure 1:
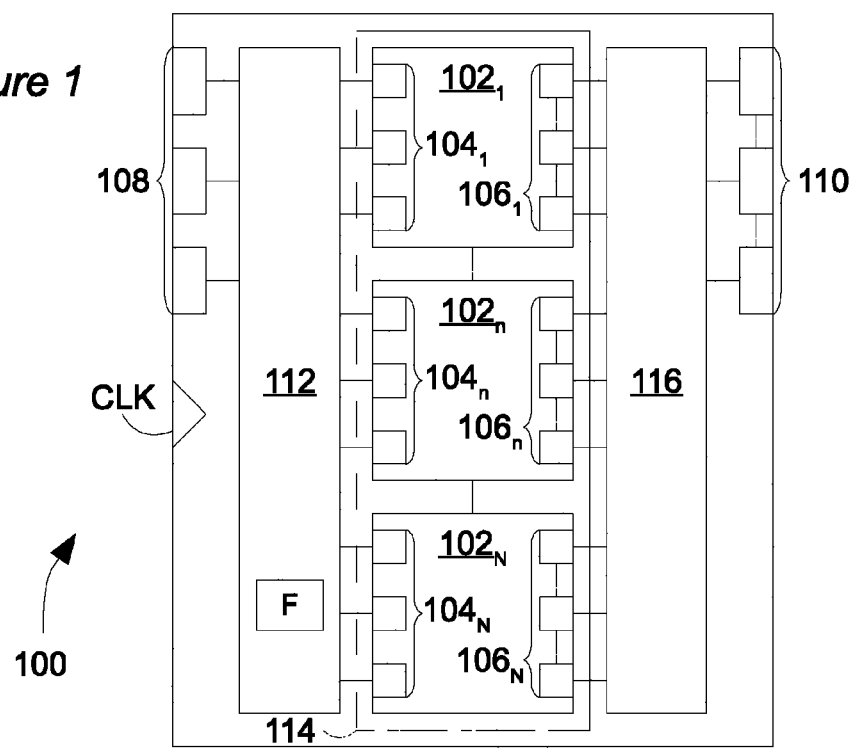
FIG. 1 is a simplified view of a storage system according to the invention.

With reference to FIG. 1, a data storage system 100 according to the invention will now be described.

The storage system 100 firstly comprises a clock signal input CLK intended to receive a clock signal for timing the storage system 100. The clock signal defines successive clock cycles.

The storage system 100 further comprises memories $102_n$ (n=1 ... N).

Each memory $102_n$ comprises one or a plurality of input ports globally designated by the reference $104_n$ and one or a plurality of output ports globally designated by the reference $106_n$.

Each input port $104_n$ of each memory $102_n$ is intended to receive, at each clock cycle, not more than one request for access to the memory $102_n$. This request is in the form of a local request indicating in particular an address of the memory $102_n$ where the access is intended to be carried out. Each input port $104_n$ is intended to receive read and write access requests, or specialised so as only to receive read access requests or write access requests.

Each output port $106_n$ of each memory $102_n$ is associated with a single input port $104_n$ and is intend to submit, at each clock cycle, not more than one response to a request obtained from the associated input port $104_n$. In the example described, only read requests are intended to give rise to a response, but not write requests. In this way, an output port $106_n$ is associated with each input port $104_n$ intended to receive at least read access requests, but there is no output port associated with the input ports $104_n$ specialised for write mode.

Each memory $102_n$ is thus intended, at each clock cycle, to obtain requests from the input ports $104_n$ thereof, to complete the requests, and to supply the output ports $106_n$ thereof with any responses. As the input ports $104_n$ are limited in number, each memory $102_n$ is only suitable for obtaining a limited number of requests at each clock cycle, hereinafter referred to as the memory "capacity".

Alternatively, the completion of the requests takes a plurality of clock cycles.

The storage system 100 further comprises at least two input ports globally designated by the reference 108 and one or a plurality of output ports globally designated by the reference 110.

Each input port 108 is intended to receive, at each clock cycle, not more than one request to access one of the memories $102_n$. This request is in the form of a global request particularly indicating a global address structured as if the storage system 100 was a single memory. Each input port 108 is intended to receive read and write access requests, or specialised so as only to receive read access requests or write access requests.

Each output port 110 is associated with a single input port 108 and is intended to submit, at each clock cycle, not more than one response to a request obtained from the associated input port 108. In the example described, only read requests are intended to give rise to a response, but not write requests. In this way, an output port 110 is associated with each input port 108 intended to receive at least read access requests, but there is no output port associated with the input ports 108 specialised for write mode.

The storage system 100 further comprises one or a plurality of processing stages intended to successively process the requests obtained from the input ports 108, to complete the requests, and to supply a response if any. The processing stage(s) are intended to be successively traversed so as to form a processing "pipeline". Preferably, each processing stage is intended to process the data received in one clock cycle. In this way, it is intended to receive, at each clock cycle, input data and to supply output data corresponding to the input data before the next clock cycle.

In the example described, the storage system 100 comprises three processing stages: a request processing input stage 112, an intermediate stage 114 containing the memories $102_n$ and output stage 116 for processing responses.

The input stage 112 is intended, at each clock cycle, to carry out the steps to be detailed with reference to FIG. 2. In sum, the input stage 112 is intended to obtain requests from the input ports 108, select some thereof, and supply the requests selected at the intermediate stage 114, i.e. at the input ports $104_n$ of the memories $102_n$. The requests are supplied in the form of local requests indicating a local address in the memory $102_n$ where the reading or writing is intended to be carried out. The input stage 112 comprises a correspondence function F associating each possible global address with one of the memories $102_n$ and with a local address in this memory $102_n$.

The output stage 116 is intended, at each clock cycle, to carry out the steps to be detailed with reference to FIG. 2. In sum, the output stage 116 is intended to obtain from the output ports $106_n$ of the memories $102_n$ any responses supplied by the memories $102_n$, to determine, for each possible response, the output port 110 whereon the response is intended to be supplied, and to supply this response on this output port 110.

Preferably, the storage system 100 is only produced with hardware components, and not with software components such as processors executing instructions saved on a storage medium.

Figure 2:
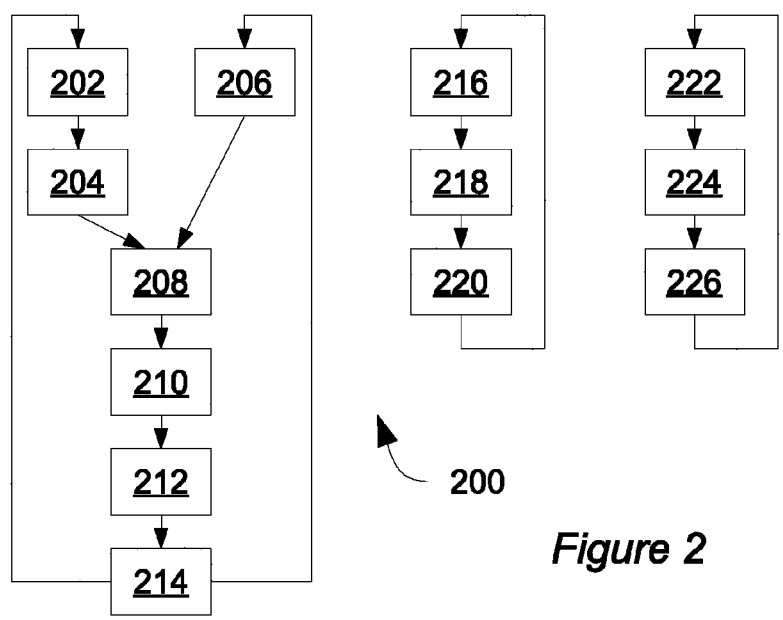
FIG. 2 is a block diagram illustrating the sequence of the steps of a method for handling requests according to the invention.

With reference to FIG. 2, a method for handling requests 200 according to the invention and implemented by the storage system 100 in FIG. 1, will be described hereinafter.

At each clock cycle, the following steps are carried out in the input stage 112.

During a step 202, in the event of no priority request at the previous clock cycle, the input stage 112 obtains new requests from the input ports 108. As explained hereinafter, a priority request is a request placed on standby at each of the last L clock cycles from the previous clock cycle, L being a predefined number greater than or equal to two.

During a step 204, for each new request obtained, the input stage 112 determines, by means of the addressing function F, the memory $102_n$ and the local address in this memory targeted by the new request.

During a step 206, in the event of one or a plurality of priority requests at the previous clock cycle, the input stage 112 refrains from obtaining new requests.

During a step 208, the input stage 112 selects, from any standby request(s) and any new request(s), at least one request intended to be supplied at the intermediate stage 114. Preferably, the selection of at least one request is carried out according to the capacity of each memory $102_n$ to obtain requests. In particular, each memory $102_n$, a number of requests less than or equal to the number of input port $104_n$ of the memory $102_n$ is selected. Preferably, the selection is carried out so as to select the greatest possible number of requests that the memory will be capable of receiving at the next clock cycle. Preferably, the selection of at least one request is carried out by giving priority to the oldest standby requests, i.e. the requests placed on standby for the greatest number of clock cycles.

In the event of no standby request, the input stage 112 thus selects at least one new request.

In the event of priority requests at the previous clock cycle, the input stage 112 thus selects at least one standby request and no new request (since no new request was received at the current clock cycle).

During a step 210, the input stage 112 supplies each request selected to an input port $104_n$ of the memory $102_n$ targeted by this request. The request is supplied in the form of a local request particularly indicating the targeted local address.

During a step 212, the input stage 112 places the non-selected request(s) on standby.

In particular, if a new request has not been selected, this new request is placed on standby.

During a step 214, the input stage 112 determines the existence or not of at least one request placed on standby for at least L clock cycles, including the current clock cycle, i.e. placed on standby at each of the last L clock cycles, including the current clock cycle. L is a predefined number less than or equal to two. Such a request is described as priority. The storage system 100 is then found in a so-called conflict situation. In this case, the input stage 112 suspends obtaining new requests for the next clock cycle. Preferably, the input stage 112 further notifies the data processing device (not shown) supplying the requests to the storage system 100 of this conflict situation, so that the latter, for example, suspends the dispatch of requests to the storage system 100 for the next clock cycle.

In parallel, the following steps are carried out in the intermediate stage 114.

During a step 216, each memory $102_n$ obtains on the input ports $104_n$ thereof the requests supplied thereto at the previous cycle in the form of local requests by the input stage 112.

During a step 218, each memory $102_n$ processes the requests obtained thereby. In particular, in the event of a write access request indicating data to be written, the memory $102_n$ writes this data at the local address. In the case of a read request, the memory $102_n$ reads the data located at the local address.

During a step 220, each memory $102_n$ supplies any responses on the output ports $106_n$ thereof. In particular, in the event of a read access request, the memory $102_n$ supplies the data read on the output port $106_n$ thereof associated with the input port $104_n$ whereon the request was obtained.

In parallel, the following steps are carried out in the output stage 116.

During a step 222, the output stage 116 obtains, from the output ports $106_n$ of the memories $102_n$, any responses supplied by the memories $102_n$.

During a step 224, the output stage 116 determines, for each possible response, the output port 110 whereon the response is intended to be supplied.

During a step 226, the output stage 116 supplies each response on the output port 110 associated with the input port 108 whereon the request corresponding to this response was received.

An example of operation of the storage system 100 implementing the handling method 200 will be described hereinafter.

In this example, the storage system 100 comprises three input ports 108 (intended to receive read and write access requests).

The storage system 100 further comprises three single-port memories $102_n$ (N=3), i.e. each having a single input port $104_n$ and a single associated output port $106_n$.

Furthermore, the predefined number L equals two, such that a request placed on standby two clock cycles in succession takes priority and gives rise to a stop in new requests being obtained.

To describe this example, a summary table will be given for each clock cycle.

The left cell of the first row of the table indicates the new requests obtained on the input ports 108 at the current clock cycle.

The right cell of the first row of the table indicates the requests remaining on standby, i.e. placed on standby at the clock cycle preceding the current clock cycle.

The right cell of the second row of the table indicates the requests selected at the current clock cycle to be supplied at the intermediate stage 114.

The left cell of the second row of the table indicates the requests placed on standby at the current clock cycle. A request determined to be priority at the end of the current clock cycle is indicated by underlining.

The requests are annotated in the following format: Xy(n) where X is a letter corresponding to the input port (A for the first port, B for the second and C for the third), y is the number of the request and n is the index of the reference of the memory $102_n$ targeted by the request.

| First clock cycle | |
|---|---|
| A1(1), B1(1), C1(2) | — |
| A1(1), C1(2) | B1(1) |

In this way, at the first clock cycle, the input stage 112 obtains new requests, supplies two new requests at the intermediate stage and places a new request on standby.

| Second clock cycle | |
|---|---|
| A2(1), B2(1), C2(3)<br>B1(1), C2(3) | B1(1)<br>A2(1), B2(1) |

In this way, at the second clock cycle, the input stage 112 obtains new requests, supplies two requests from the new requests and the standby request and supplies these new requests. One of the two requests selected is a new request obtained at the second clock cycle.

| Third clock cycle | |
|---|---|
| A3(2), B3(3), C3(3)<br>A2(1), A3(2), B3(3) | A2(1), B2(1)<br>B2(1), C3(3) |

In this way, at the third clock cycle, the input stage 112 determines the existence of a priority request.

| Fourth clock cycle | |
|---|---|
| —<br>B2(1), C3(3) | B2(1), C3(3)<br>— |

In this way, at the fourth clock cycle, the input stage suspends obtaining new requests, and supplies the priority request along with a non-priority request.

| Fifth clock cycle | |
|---|---|
| A5(3), B5(2), C5(3)<br>B5(2), A5(3) | —<br>C5(3) |

To illustrate the results that can be obtained using the storage system 100 and the handling method 200 further, the ratio between the number of clock cycles wherein no new request is obtained due to the presence of at least one priority request at the previous clock cycle and the number of clock cycles wherein new requests are obtained due to the absence of priority requests at the previous clock cycle. The ratio was calculated for a plurality of values of the predefined number L, in the event of requests targeting the memories $106_n$, at random and the storage system 100 comprising thirty-two input ports 108 and forty-eight single-port memories $102_n$ (N=48).

The results obtained are summarised in the table below.

| L | ratio |
|---|---|
| 1 | 1.78 |
| 2 | 1.14 |
| 3 | 0.62 |
| 4 | 0.3 |
| 5 | 0.14 |

The invention is not limited to the examples of embodiment described above, but on the contrary defined by the claims hereinafter.

It will indeed be obvious to those skilled in the art that various modifications may be made to the examples of embodiments described above, in the light of the teaching disclosed herein.

Furthermore, in the claims hereinafter, the terms used should not be interpreted as limiting the claims to the features of the examples of embodiments described above, but should be interpreted to include any equivalent that can be envisaged by those skilled in the art by applying their general knowledge.

The invention claimed is:

1. A method for handling requests received by a storage system (100) that has a memory stage (114) containing memories ($102_n$), a clock input (CLK) configured to receive a clock signal defining successive clock cycles, a request input (108) for receiving requests, each of said requests requesting access to a location of one of the memories ($102_n$), and a processing stage (112), the method comprising:
   determining (214), by the processing stage (112), an existence or not of an old standby request, said old standby request being defined as a request that, at every one of L consecutive clock cycles immediately preceding a first clock cycle, i) has not been supplied to the memory stage (114), and ii) has been placed on standby in the processing stage, L being a predefined number greater than or equal to two; and
   at the first clock cycle:
      in the event that no old standby request is determined, the following steps are performed:
         obtaining (202), by the processing stage (112), one or more new requests from the request input (108), and
         selecting (208), by the processing stage (112), at least one request from the new request(s) and one or more standby requests if any, said standby requests being requests that have not been supplied to the memory stage (114) and have been placed on standby in the processing stage (112) during a previous clock cycle immediately preceding the first cycle;
      in the event that at least one old standby request is determined, the following steps are performed:
         suspending (206), by the processing stage (112), new requests from being obtained from the request input (108) for the first clock cycle, and
         selecting (208), by the processing stage (112), one or more of the standby request(s) not supplied to the memory stage (114) and placed on standby in the processing stage (112) during the previous clock cycle;
      supplying (210), by the processing stage (112), the selected request(s) to the memory stage (114); and
      not supplying to the memory stage (114), and placing on standby (212), all non-selected request(s) by the processing stage (112).

2. The method according to claim 1, wherein the selection (208) by the processing stage (112) of at least one request comprises the selection of a standby request.

3. The method according to claim 1, wherein the selection (208) by the processing stage (112) of at least one request comprises the selection of a new request.

4. The method according to claim 1, wherein, for at least one of the memories ($102_n$), the selection of at least one request to be supplied to said at least one of the memories is carried out so as to select the greatest possible number of requests that the memory can receive at the next clock cycle.

5. The method according to claim 1, wherein, for at least one of the memories ($102_n$), the selection of at least one request to be supplied to said at least one of the memories is carried out by giving priority to the requests placed on standby for the greatest number of clock cycles.

6. A data storage system (100), comprising:
a memory stage (114) containing memories (102$_n$);
a clock input (CLK) that receives a clock signal defining successive clock cycles; and
a request input (108) that receives requests, each of said requests requesting access to a location of one of the memories (102$_n$);
a processing stage (112), configured by way of programming encoded in a programming memory such that, during operation, said processing stage (112):
determines (214) the existence or not of an old standby request, said old standby request being defined as a request that, at every one of L consecutive clock cycles immediately preceding a first clock cycle, i) has not been supplied to the memory stage (114), and ii) has been placed on standby in the processing stage, L being a predefined number greater than or equal to two;
and, at the first clock cycle:
in the event that no old standby request is determined, the processing stage (112):
obtains one or more new requests from the request input (108), and
selects (208) at least one request from the new request(s) and one or more standby request(s) if any, said standby requests being requests that have not been supplied to the memory stage (114) and have been placed on standby in the processing stage (112) during a previous clock cycle immediately preceding the first cycle;
in the event that at least one old standby request is determined, the processing stage (112):
suspends (206) new requests from being obtained from the request input (108) for the first clock cycle, and
selects (208) one or more of the standby request(s),
supplies the selected request(s) to the memory stage (114) not supplied to the memory stage (114) and placed on standby in the processing stage (112) during the previous clock cycle,
wherein the processing stage (112) supplies the selected request(s) to the memory stage (114), and
wherein the processing stage (112) places all the non-selected request(s) on standby.

7. The method according to claim 1, wherein the selection (208) by the processing stage (112) of at least one request comprises the selection of a standby request.

8. The method according to claim 1, wherein the selection (208) by the processing stage (112) of at least one request comprises the selection of a new request.

9. The method according to claim 1,
wherein the request input comprises input ports (108) that each receive, at each clock cycle, not more than one request, and
wherein, when a request received from one of the input ports (108) is placed on standby during the first clock cycle, a new request is received by said input port (108) at a following clock cycle immediately following the first clock cycle.

10. The data storage system according to claim 6,
wherein the request input comprises input ports (108) that each receive, at each clock cycle, not more than one request, and
wherein, when a request received from one of the input ports (108) is placed on standby during the first clock cycle, a new request is received by said input port (108) at a following clock cycle immediately following the first clock cycle.

\* \* \* \* \*